(12) United States Patent
Rich et al.

(10) Patent No.: US 6,464,069 B1
(45) Date of Patent: Oct. 15, 2002

(54) QUADRUPLE PICK AND PLACE HEAD CONSTRUCTION

(76) Inventors: Donald S. Rich, IntellePro, Inc. 190 Strykers Rd., Phillipsburg, NJ (US) 08865; David M. Sharman, Intellepro 190 Strykers Rd., Phillipsburg, NJ (US) 08865-9702

( * ) Notice: Subject to any disclaimer, the term of this patent is extended or adjusted under 35 U.S.C. 154(b) by 0 days.

(21) Appl. No.: 09/519,342

(22) Filed: Mar. 6, 2000

(51) Int. Cl.[7] .............................................. B65B 47/00
(52) U.S. Cl. ...................... 198/468.3; 294/65; 294/87.1
(58) Field of Search .......................... 414/752.1, 749.1; 198/468.3; 294/65, 87.1; 901/40

(56) References Cited

U.S. PATENT DOCUMENTS 5,575,376 A * 11/1996 Colamussi ............... 198/468.3
5,904,387 A * 5/1999 Nagai et al. ............... 901/40 X
5,950,802 A * 9/1999 Kubota ..................... 198/468.3

* cited by examiner

*Primary Examiner*—Donald W. Underwood
(74) *Attorney, Agent, or Firm*—Charles E. Temko

(57) ABSTRACT

A pick and place quadruple head construction for transferring as many as four small workpieces such as computer chips and the like simultaneously from a first matrix to a second matrix. The four individual head units are arranged to form a rectangular area which may be contracted or enlarged upon moving three of the units relative to each other along two mutually perpendicular axes. Each unit includes a reciprocable spindle capable of movement along a third axis, and rotatable about the third axis in repeatable cyclic manner. The spindles include vacuum means for picking up and releasing transferred workpieces. Also disclosed is a wear compensating structure for the spindle. In several of the disclosed embodiments, the head units are arranged such that the reciprocating spindles are located in a common vertical plane so that the articles deposited on the place matrix permit an in-line separation.

3 Claims, 13 Drawing Sheets

QUADRUPLE PICK AND PLACE HEAD CONSTRUCTION

BACKGROUND OF THE INVENTION

This invention relates generally to the handling and transfer of small articles, such as computer chips and the like from a first location to a second location, and more particularly to an improved multiple pickup head construction which provides for the transfer of as many as four individual workpieces between a first matrix and a second matrix.

Pickup units of this type are known in the art, and usually include a reciprocating spindle having vacuum means extending through a hollow channel to enable the workpiece to be engaged and subsequently disengaged at the release location.

The semi-conductor industry has an ever present need for high-speed pick and place of semi-conductor chips. This is particularly true in at least three areas in semi-conductor direction and use, including inspection, singulation, and circuit board population.

In general, these three areas all require the picking and placing of chips during processing. Until recently, this was accomplished using a single head unit. In my earlier presently pending provisional application, Serial No. 60/013,239, there is disclosed a dual head construction which, in effect, doubles the speed of pick and place relative to a single head. The presently disclosed quadruple head construction quadruples the speed of picking and placing as compared to a single head.

As an example, one operation is an inspection system for checking chips for visual flaws. With a dual head construction it is typically possible to process six thousand to eight thousand chips per hour. The same machine with a quadruple head may process twelve thousand to sixteen thousand chips per hour. Since these systems are very costly, the advantages of increased speed are obvious.

In addition to the need for speed, the other requirement centers about programmability for varying matrix configurations encountered in chip media, i.e. matrix trays used during semi-production, tape and reel used to ship chips, and strips or wafers that are singulated to yield individual chips from a batch.

During some manufacturing operations, it is desirable to arrange for deposition of articles on a place matrix such that the deposited articles are arranged in single line fashion to permit ready and serial removal of defective articles on inspection.

SUMMARY OF THE INVENTION

The present invention is directed to a means for positioning quadruple pick and place probes in a programmable matrix structure. Positioning includes an XY axis capability for the matrix, a Z axis capability to extend or retract individual probes, and a capability to rotate individual probes. Each of the four probes supports a vacuum cup with a through the spindle passage to apply vacuum to a chip or other object if required. The disclosed device could be used as an end of an arm effector for a robot enabling it to move four objects simultaneously from one matrix location to another.

In several disclosed embodiments, the head units are arranged such that the spindles each have an axis lying in a common vertical plane so that articles deposited on the place matrix are arranged in in-line fashion to permit ready inspection and possible removal if faulty.

BRIEF DESCRIPTION OF THE DRAWINGS

In the drawings, to which reference will be made in the specification, similar reference characters have been employed to designate corresponding parts throughout the several views.

DETAILED DESCRIPTION OF THE DISCLOSED EMBODIMENTS

Overview

Figure 1:
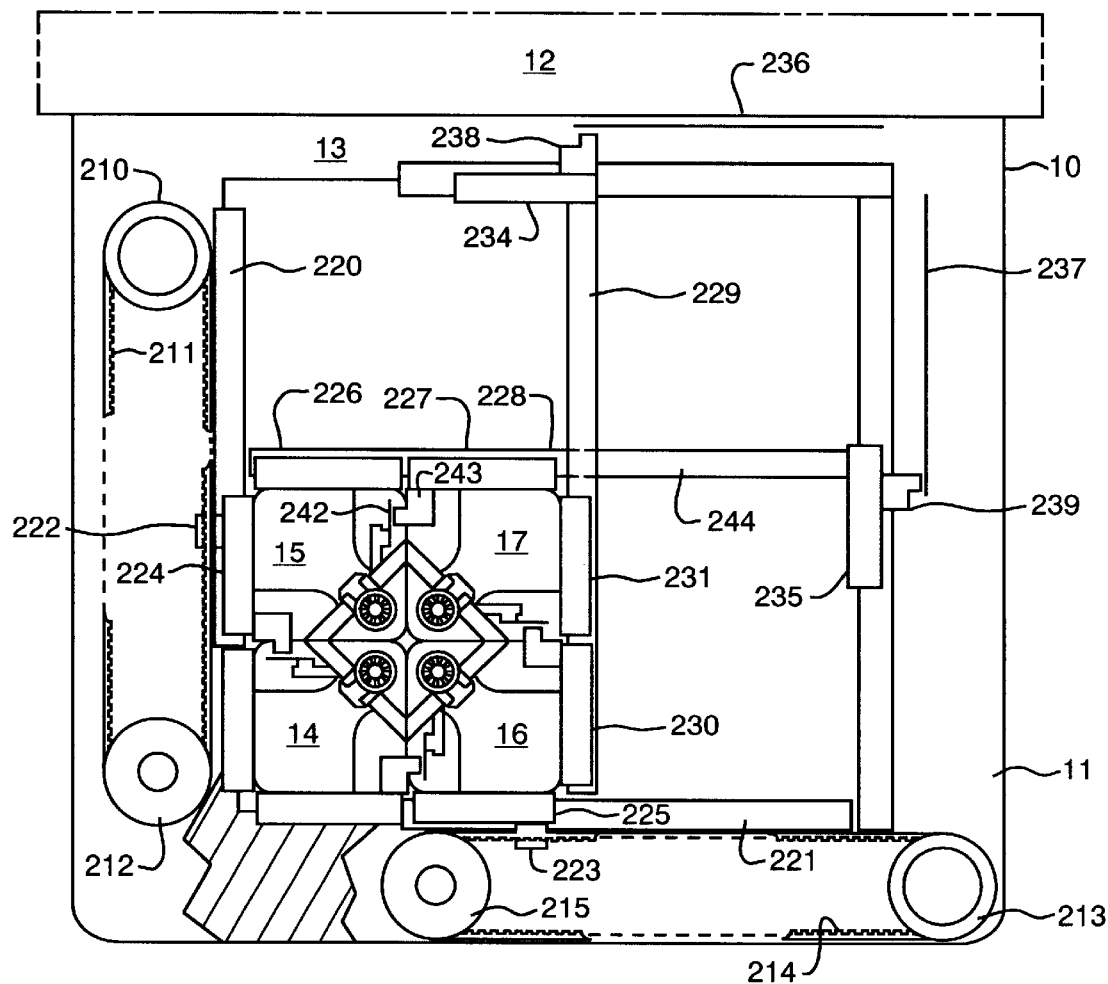
FIG. 1 is a schematic bottom plan of an embodiment of the invention showing minimum center-to-center spindle positions.

The present invention contemplates the provision of a device capable of performing six primary pick and place functions:

1. The positioning of four probes in a two-by-two matrix on centers corresponding to a media matrix containing four target objects.

2. The acquisition of the target objects through probe to contact Z-axis motion carrying vacuum cups or grippers.

3. The retraction of the probes to effect a pick through upward Z-axis motion.

4. Matrix transposition of the four probes to accommodate the matrix pattern of the placement or receiving media.

5. Rotation of the target objects via the probe spindles to a desired angular position.

6. Placement of the target objects in the new matrix media or location.

One significant requirement for the performance of these tasks involves the positioning of the four probes on very close centers. The disclosed structure of the pick and place individual units allows for centers as close as 10 mm. In devices of this nature, it is very difficult to provide this capability without sacrificing some other required function. The present invention overcomes these limitations.

In general, the disclosed device would be mounted on a overhead gantry, positioning table or slide or affixed to a robotic arm to increase its utility.

Only two servo motors, one for the Y axis and the other for the X axis, are required to drive the matrix transformation along these axes. A Y axis transform is generated when a single motor drives a belt to drive a second unit relative to a fixed first unit along a linear rail. In a similar manner, an X axis transformation is generated by a second motor acting on a second belt on a third unit. Thus, the device has the ability to change center distances of four probes in a two-by-two matrix using only two motors.

In order to take full advantage of the matrix positioning capability disclosed, the "pick" aspect of the mechanism should allow for close center-to-center spindle placement. Each spindle requires both rotation and translation capability. To overcome this problem, a cantilevered spindle is incorporated in each unit. The cantilever allows a linear bearing to be interposed between a Z axis drive rack and spindle. This, in turn, allows a spindle offset to a corner of the unit. Since the corner provides equal distances from Y and X axes unit boundaries, it allows equal minimum center-to-center distances for four units. A typical actual center-to-center distance for this geometry may be as little as 0.400 inch.

Since each spindle has a rotation and translation capability, a very compact spline drive is provided that fits within these centers. A vacuum delivery structure is provided for the spindle which allows a degree of flexibility as the spindle rotates without disturbing the vacuum. A compensating spline ball drive adjusts for wear which occurs with spindle reciprocation to provide zero backlash without positional loss as the spline wears. This is accomplished by providing a cartridge containing three balls, each arranged 120 degrees apart in a bore which allows transverse float. A tapered collar is driven against the balls by a spring which is adjusted to provide tension by a rotational nut. The balls ride in grooves in the spline. As the grooves wear deeper over time, the collar working through an angled surface exerts a normal force on each ball forcing it deeper into the groove in the spline, thus compensating for wear. A 28 degree angle with respect to the principal axis of the spline has been found to provide a good balance of adequate preload using a wave washer without excessive frictional load. A cylindrical surface is provided adjacent the camming surface which acts as a stop to eliminate torque out from total ball displacement.

In the semi-conductor industry, static electric charge can be very destructive. A pick and place mechanism must present a ground path from the probe that is under 10 ohms to ensure safe chip handling. In the present construction, a discharge path is provided including a torsion spring arranged to act under tension between the pick and place unit and the spindle drive rotating nut to serve as a "brush" allowing the spindle to rotate freely while providing a conductive path from the block through the rotate nut to the ball drive and finally the spindle. The unit itself may be wired to a convenient system ground to drain off static electricity and safeguard semi-conductors in process.

Although not illustrated and described, it will be understood by those skilled in the art that each of the head units includes an encoder to complete a servo loop, and a reading head responsive to a computer program.

Figure 2:
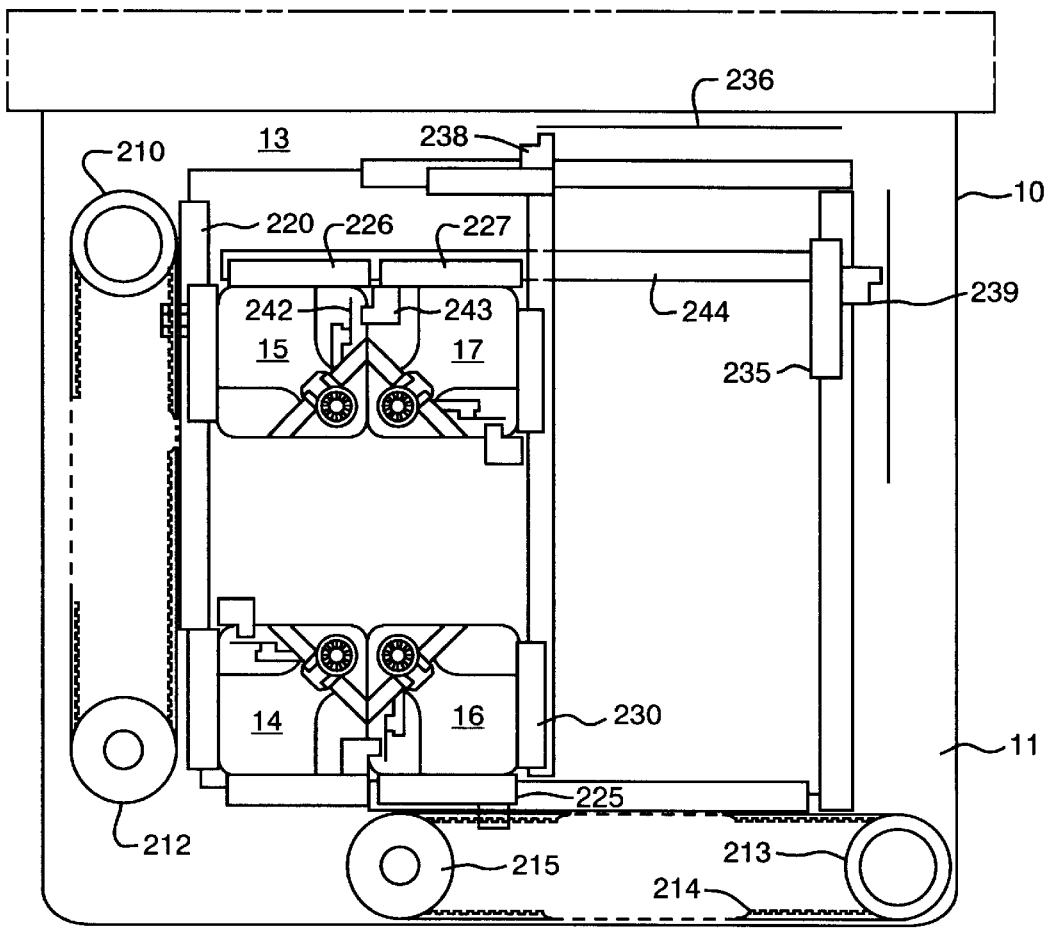
FIG. 2 is a similar schematic bottom plan view showing an intermediate center-to-center positioning of individual head units.
Figure 3:
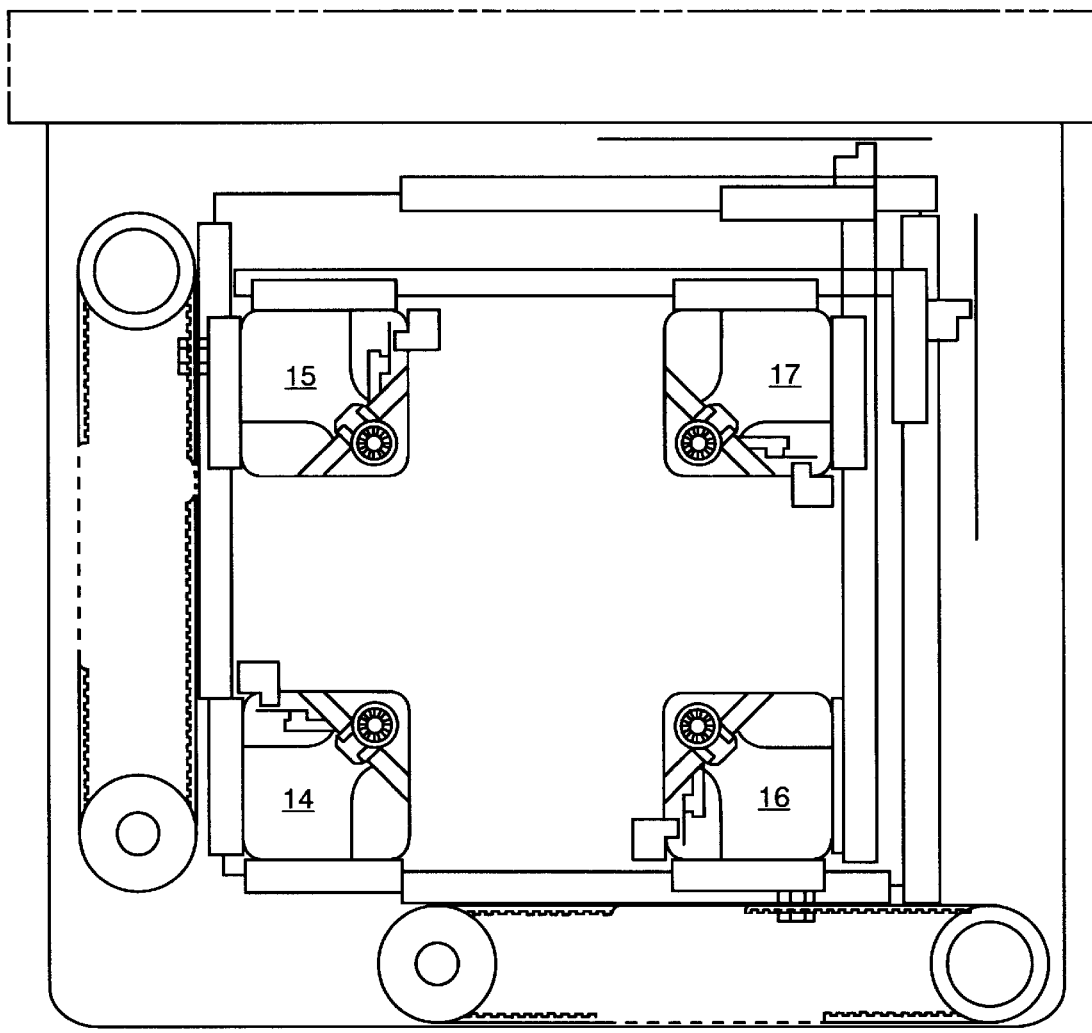
FIG. 3 is a similar schematic view showing maximum center-to-center spindle positions.
Figure 13:
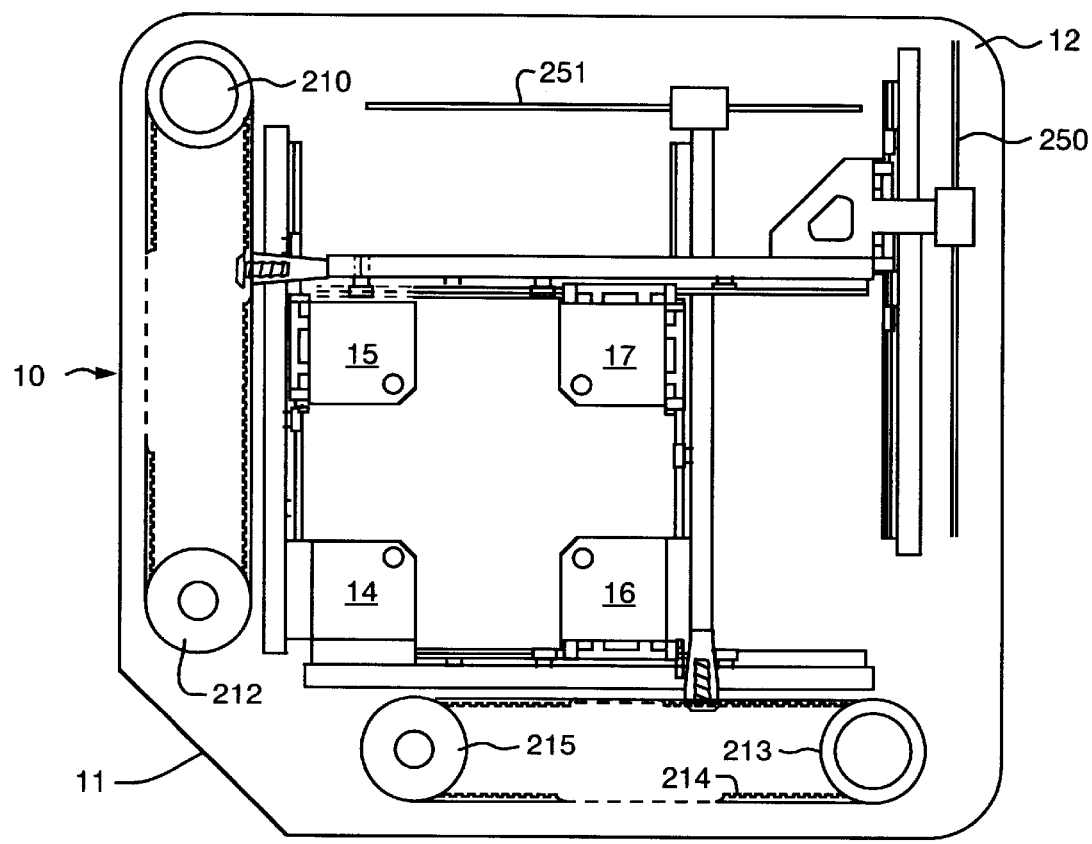
FIG. 13 is a schematic bottom plan view showing means for transferring individual pickup head units in a horizontal plane.

With the foregoing in mind, referring to FIGS. 1 to 3, inclusive, and FIG. 13, the device, generally indicated by reference character 10, includes a generally rectangular supporting frame 11, in turn carried by a fixed or movable support 12 (FIG. 13).

The frame 11 includes a downwardly facing planar surface 13 which mounts first, second, third, and fourth head units 14, 15, 16, and 17, respectively. The units are generally similar, and are arranged such that the spindles are in close mutual spacing.

Figure 7:
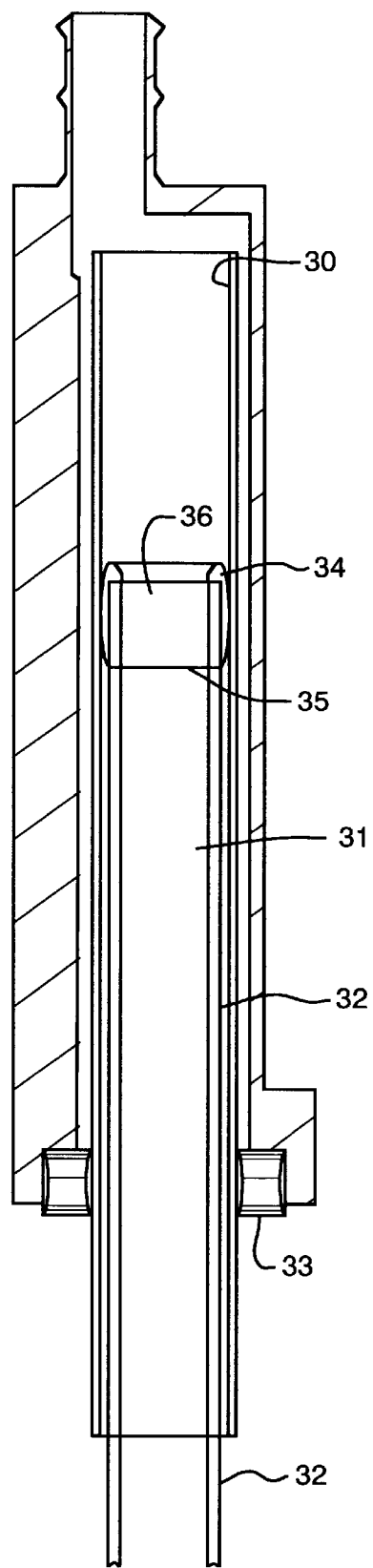
FIG. 7 is a schematic vertical sectional view showing a floating vacuum tube comprising a part of an individual spindle.
Figure 10:
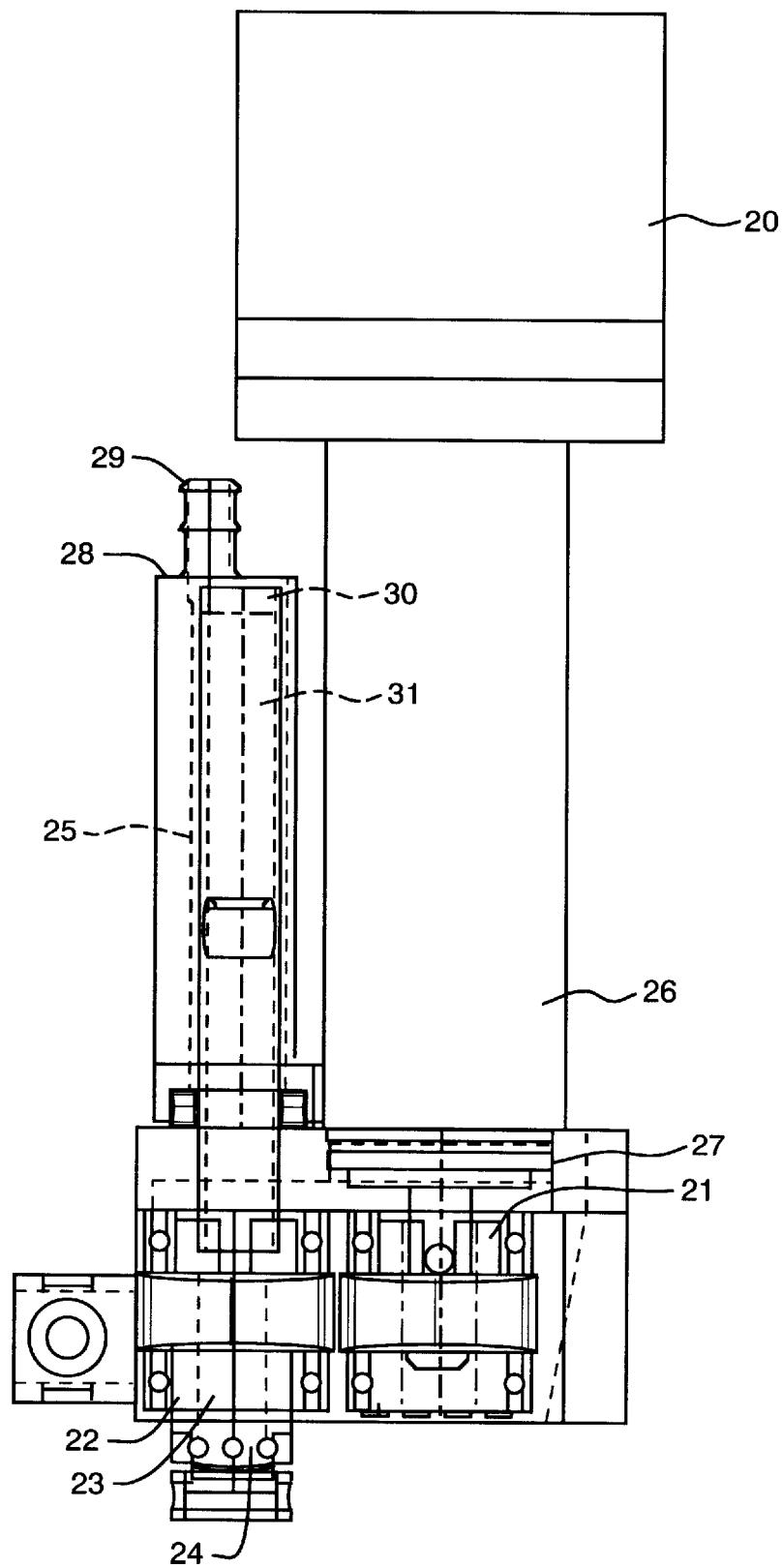
FIG. 10 is a schematic vertical sectional view showing the driving means for an individual spindle.

Referring to FIGS. 7 and 10, a server motor 20 drives a helical gear 21 and helical rack 22 serving to reciprocate a driven shaft 23 having a hollow spindle 24 within a housing 25. A second motor 26 drives a belt 27 to rotate the spindle about its own axis. An elongated vacuum housing 28 includes an upper port 29 connected to source of vacuum. A bore 30 supports a floating tube 31 having an outer surface 32 supporting an elastomeric bearing 33 supporting a surface 34 of a piston 35 on an upper end 36. During reciprocation of the spindle, the floating tube 31 will accommodate minor eccentricity of the spindle as it rotates in the order of several thousandths of an inch without loss of vacuum.

Figure 4:
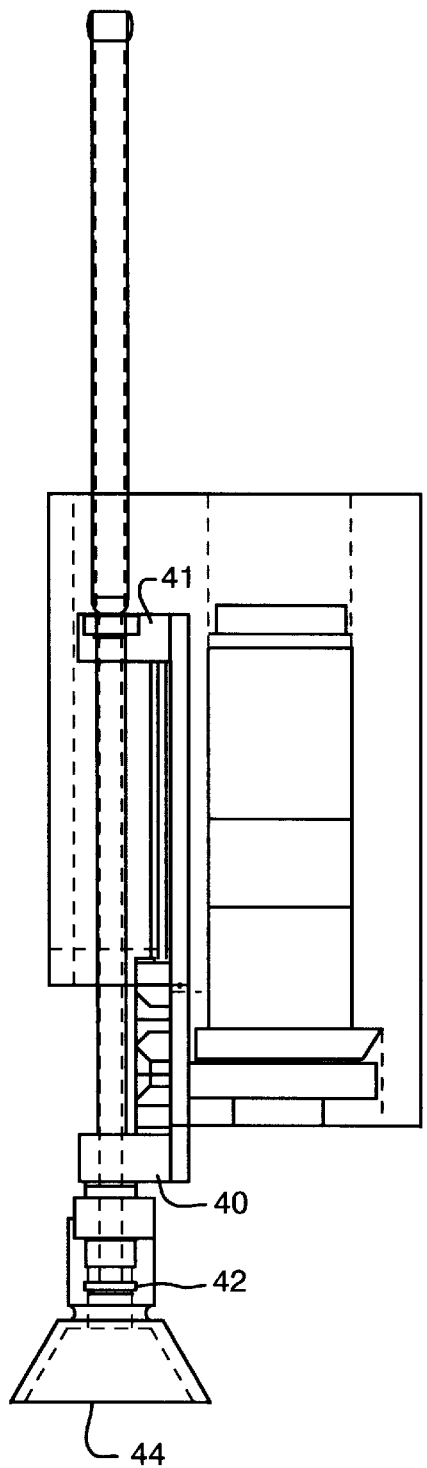
FIG. 4 is a vertical schematic elevational view showing an individual spindle in fully retracted condition.
Figure 5:
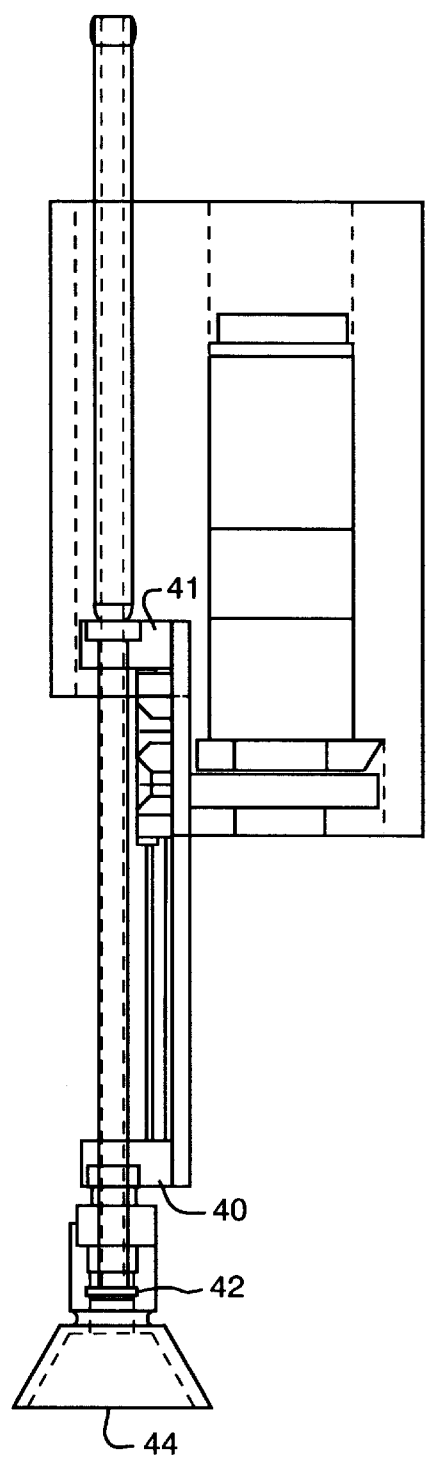
FIG. 5 is a similar schematic view showing the spindle in fully extended position.
Figure 6:
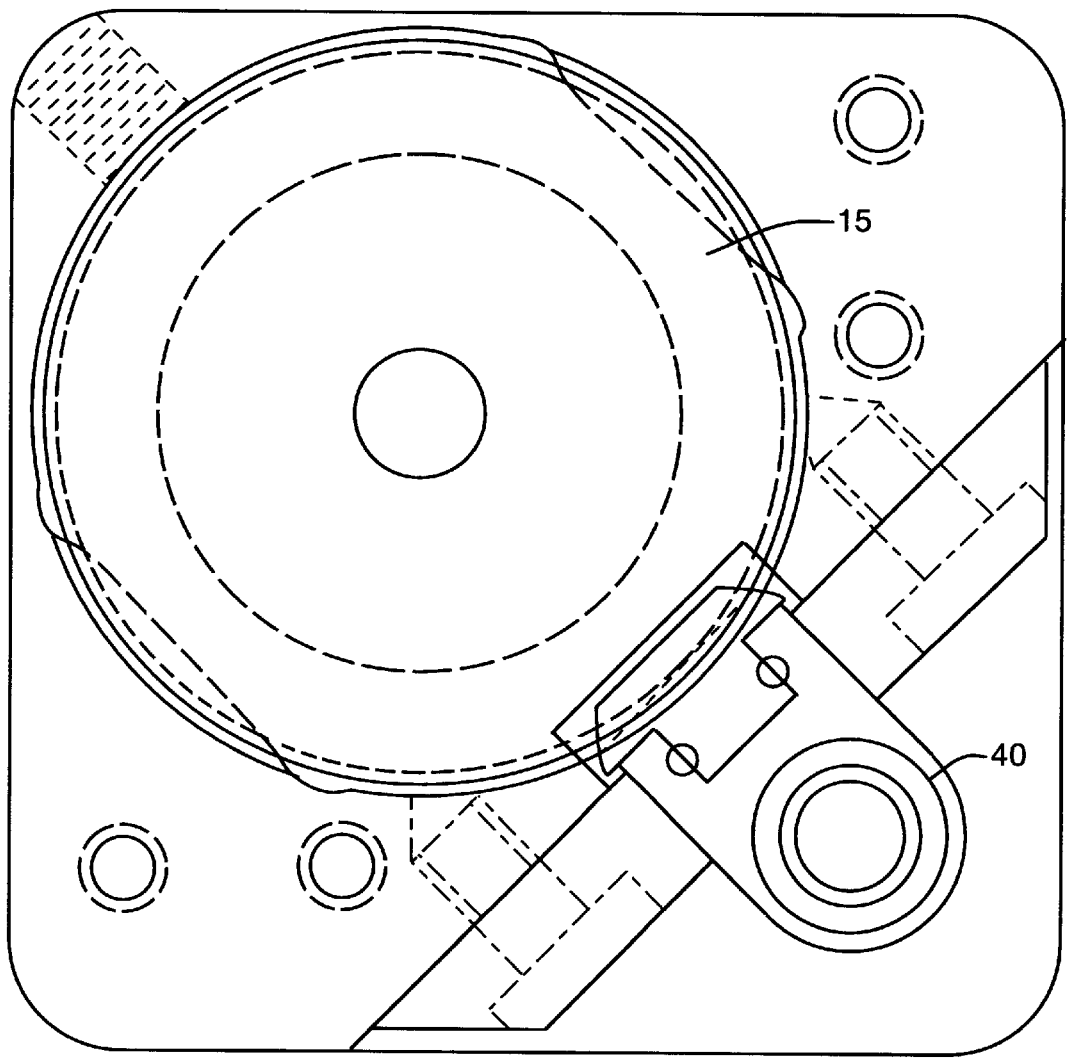
FIG. 6 is a schematic top plan view showing the positioning of an individual spindle relative to an individual head unit.

Referring to FIGS. 4 and 5, the former of which illustrates a fully retracted spindle, and the latter of which illustrates a fully extended spindle, the spindle of each unit 24 is supported on a linear bearing 40 and a radial bearing 41. The spindle is connected through an adapter 42 to permit easy removal and has a lower terminal including a vacuum probe 44.

Figure 9:
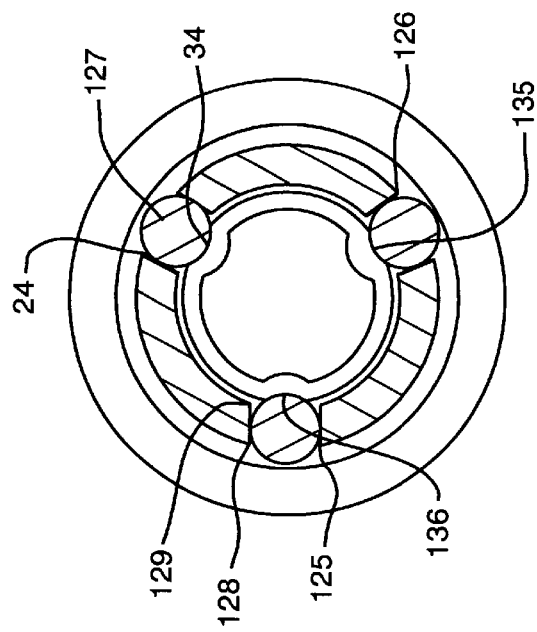
FIG. 9 is a transverse sectional view as seen from the plane 9—9 in FIG. 8.
Figure 8:
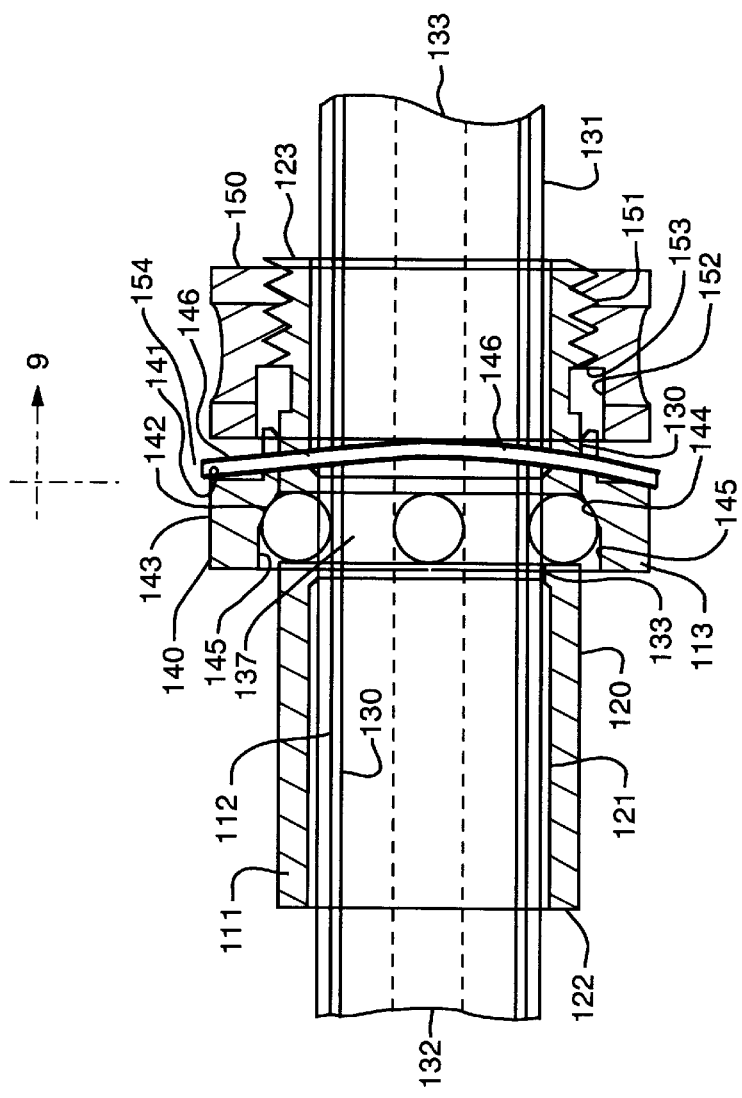
FIG. 8 is a fragmentary schematic longitudinal sectional view showing a wear compensating ball spline drive.

FIGS. 8 and 9 illustrate the disclosed compensating ball spline drive. The drive, generally indicated by reference character 110, includes an outer or drive element 111, an inner or driven element 112, and interconnecting means 113.

The element 111 is in the form of an elongated hollow shaft bounded by an outer surface 120, an inner surface 121, as well as first and second ends 122 and 123. Disposed medially between said ends are first, second, and third radially extending bores 124, 125, and 126, each accommodating a spherical ball 127. The bores each include an outer cylindrical end 128 and an inner end 129 of spherical configuration to form a ball-retention means.

The inner or driven element 112 is in the form of a solid or hollow cylinder, and is bounded by an inner surface 130, an outer surface 131, as well as first and second ends 132 and 133. The outer surface 131 is provided with cylindrically-shaped grooves 135, 135, and 136 which are disposed in a recessed segment 137 bounded by side walls 138 and 139.

The interconnecting means 113 includes a cylindrical collar 140 bounded by first and second transverse surfaces 141 and 142, an outer surface 143, and a frusto-conical camming surface 144 leading to a cylindrical surface 145. The conical surface 144 is preferably approximately 28 degrees with respect to the principal axis of the collar. The collar 140 is urged leftwardly as seen in FIG. 8 by a spring washer 146, the outer edge of which engages the collar. A threaded nut 150 includes an internally threaded bore 151 communicating with a cylindrical bore 152 forming a channel inwardly of a radial surface 153 which contacts an edge 154 of the spring washer 146.

During operation, the inner member executes necessary operational axial movement with respect to the outer member, with rotational movement being transmitted solely by engagement of the balls 127 in a respective engaged channel 134–136. Normally, little if any rotation of the balls will occur during reciprocating movement of the spindle. As wear occurs, tension transmitted to the balls will continuously take up any slack developed, so that precision of rotational movement is preserved.

Figure 11:
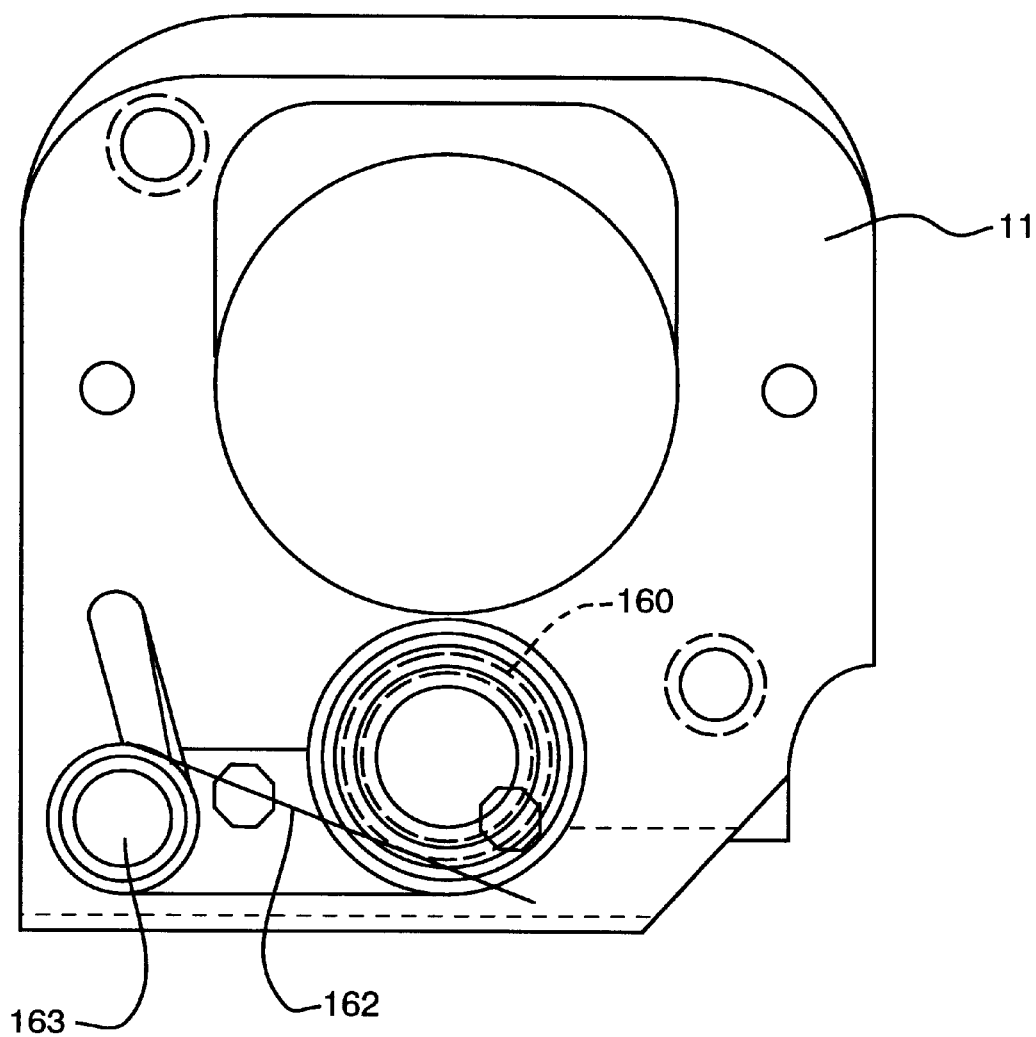
FIG. 11 is a schematic view showing an electrostatic discharge path for an individual head unit.

Referring to FIG. 11, there is illustrated a means for discharging static electricity charges which may be present on an individual workpiece. This is accomplished by employing a torsion spring 160, the coiled portion of which surrounds the spindle support mechanism. A free end 162 extends tangentially to an arbor 163 on the frame 11 which may be grounded in conventional manner, using a flexible wire (not shown).

Figure 12:
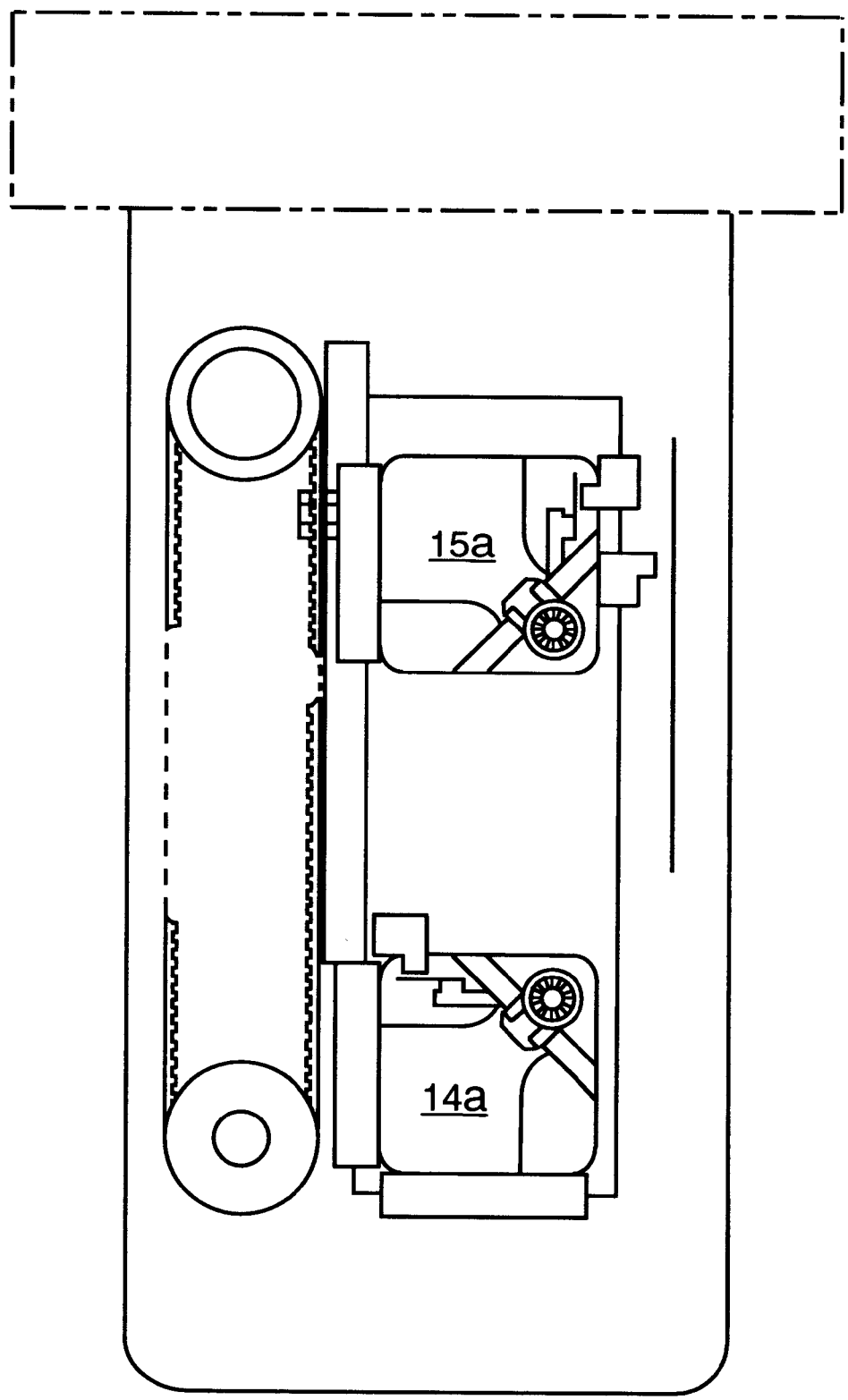
FIG. 12 is a schematic bottom plan view showing an alternate form of the invention.

FIG. 12 is an alternate form of the invention employing only a first head 14a and a second head 15a for use where only two more pieces are engaged simultaneously.

Referring again to FIGS. 1 to 3 and FIG. 13, there is illustrated the means by which the individual units 14–16, inclusive are capable of relative motion between pick and place locations. An x axis motor 210 drives a cogged belt 211 on an entraining pulley 212. Adjacent fixed guiding supports 220 and 221 respectively guide units 15 and 16 for respective Y axis and X axis movement. Clamps 222 and 223 engage segments of the cogged belts 211 and 214 for this purpose. Sliding guides 224 and 225 are carried by the units to ensure rectilinear movement. Unit 15 carries support 226 which fixedly mounts an X axis rail 228 engaged by a sliding guide 227 on unit 17. In a similar manner, unit 16 carries Y axis guide 229 by fixed support 230 to enable sliding movement of guide 231 on unit 17. Movement is limited by stops 243 and 235.

From a consideration of the above, it will be apparent that unit 14 remains fixed relative to the frame 11. Unit 15 is capable of Y axis movement only, while unit 16 is capable of X axis movement only. The Y axis movement of unit 15 is transmitted to unit 17, and the X axis movement of unit 16 is also transmitted to unit 17. The limits of movement are governed by code bars 236 and 237 and corresponding reading heads 238 and 239. Z axis movement executed by the spindle is governed by code bars 242 and corresponding reading heads 243.

FIG. 13 illustrates optional supporting rails 250 and 251 which guide the free ends of the rails carried by units 15 and 16 at the ends thereof to provide the stability of the free ends of the rails.

Computer programming is transmitted to the code reading heads in a manner well known in the art. It is thus possible to obtain relative movement of the heads 15, 16, and 17 to desired degree during movement between the pick and place matrices, and individual control of the reciprocating movement of the spindle of each of these units.

Figure 14:
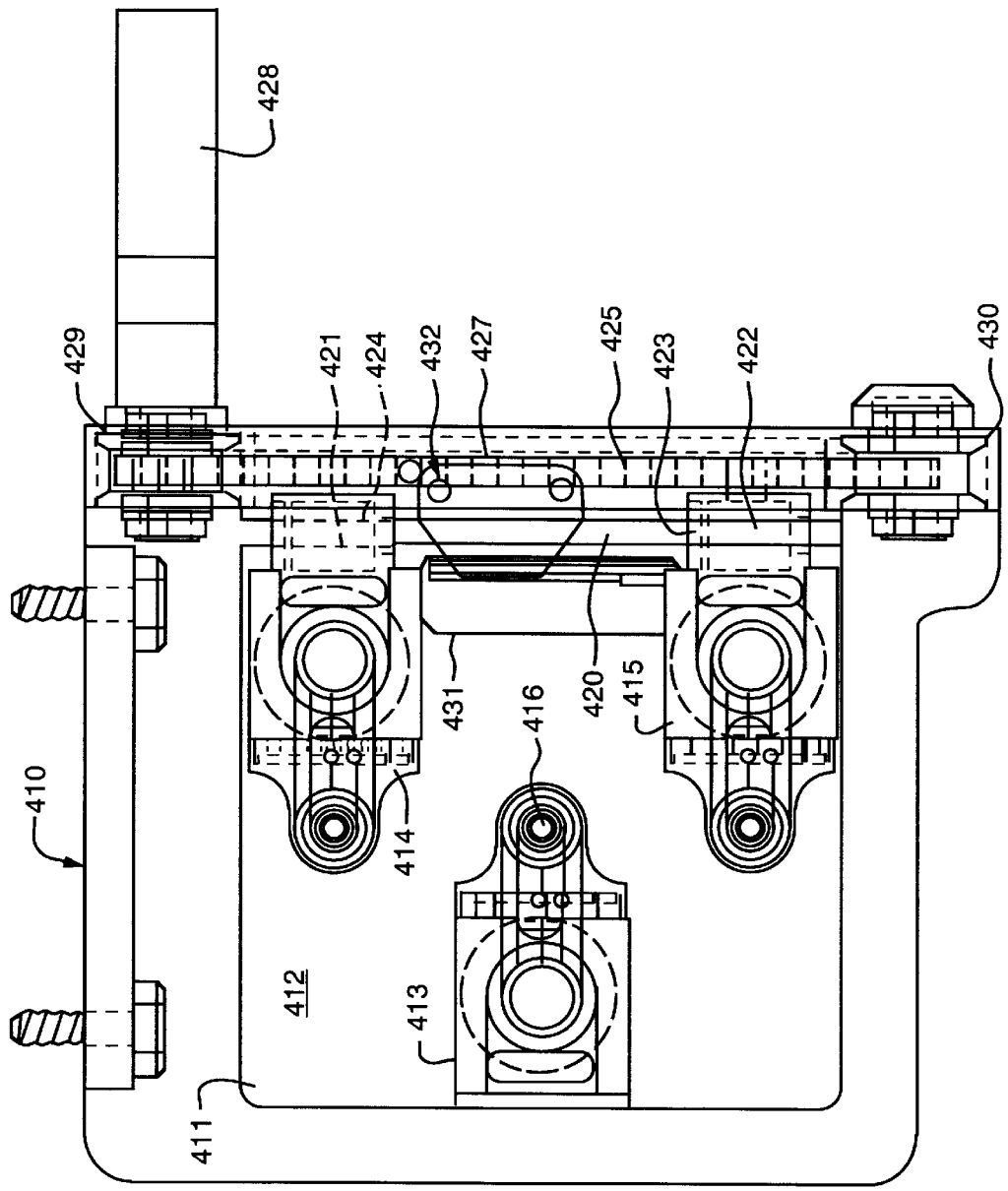
FIG. 14 is a schematic plan view showing a further embodiment of the invention.
Figure 15:
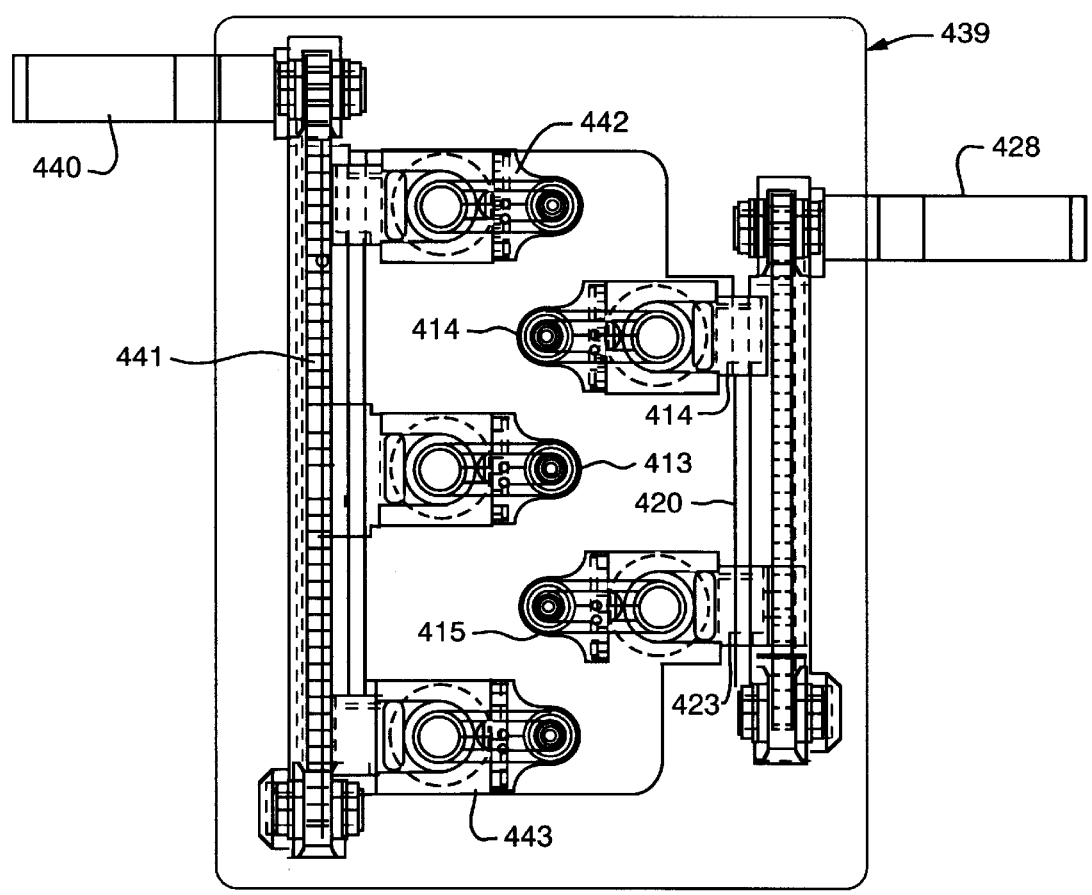
FIG. 15 is a schematic plan view showing another embodiment of the invention.

As mentioned hereinabove, it is often desirable to have the multiple pick and place head units in a linear array with programmable spindle centers, the axes of which lie in a common vertical plane. The embodiment illustrated in FIG. 14 depicts triple or three spindle head units while FIG. 15 illustrates a "penta" or five spindle version. In general, this arrangement lends itself to the construction of a linear array with an odd number of spindles, with one spindle remaining in position during pick and place transfer.

Referring to the embodiment shown in FIG. 14, and generally indicated by reference character 410, a supporting platform 411 includes an upper surface 412 mounting a first head unit 413, a second head unit 414, and a third head unit 415, each having a reciprocating spindle 416. Head unit 413 remains fixed in position, while head units 414 and 415 are capable of movement in opposite directions along a Y axis.

Unit 413 is directly mounted upon the surface 412. Units 414 and 415 are each provided with a supporting guide 420 which slidably engages keyed brackets 421 and 422. The brackets include clamps 423 and 424, respectively, one of which engages an upper segment 425, and the other a lower segment (not shown) of a cogged belt 427 driven by a servo motor 428 and driven pulley 429. An idler pulley 430 maintains the belts in taught condition. Operation of the servo motor 428 is governed by a platform mounted encoder scale 431 and a code sending head 432 on the belt.

Referring to the embodiment shown in FIG. 15, and generally indicated by reference character 439, there is provided an additional servo motor 440 and cog belt 441 as well as additional head units 442 and 443. The operation is substantially identical, although the units 442 and 443 move a greater distance from the fixed unit, so that all of the transferred articles (not shown) will be placed in the place matrix along a single line.

We wish it to be understood that we do not consider the invention to be limited to the details illustrated and described in the specification, for obvious modifications will occur to those skilled in the art to which the invention pertains.

What is claimed is:

1. A pick and place head element for transporting articles positioned upon a first matrix to a second matrix, in which said articles are positioned upon said second matrix in differing positions relative to positions on said first matrix, comprising at least first, second, third, fourth, and fifth head units, said first head unit being in relatively fixed position upon a common supporting platform lying in a horizontal plane, a guiding rail slidably supporting said second head unit, belt driven means engaging said second head unit; said third head unit being mounted for sliding movement on said rail, said belt driven means including a pair of parallel belt segments moving in opposite directions, each segment being coupled to one of said second and third head units; a second rail slidably supporting said fourth and fifth head units, and second belt driven means including third and fourth rectilinear segments coupled respectively to said fourth and fifth head units.

2. A pick and place head unit in accordance with claim 1, wherein said fourth and fifth head units are simultaneously driven with said second and third head units through relatively greater degrees of linear displacement.

3. A pick and place head element in accordance with claim 2, in which said second and third head units are driven by a single servo motor, and said fourth and fifth head units are driven by a second servo motor.

* * * * *